(12) United States Patent
Mathad et al.

(10) Patent No.: US 6,489,249 B1
(45) Date of Patent: Dec. 3, 2002

(54) ELIMINATION/REDUCTION OF BLACK SILICON IN DT ETCH

(75) Inventors: Gangadhara S. Mathad, Poughkeepsie, NY (US); Rajiv Ranade, Brewster, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/597,441

(22) Filed: Jun. 20, 2000

(51) Int. Cl.$^7$ .............................................. H01L 21/00
(52) U.S. Cl. .................... 438/729; 156/345.3; 156/915; 216/67; 438/710
(58) Field of Search ................................ 438/710, 712, 438/729; 216/67; 156/345 P, 345 PW, 345 WH, 345.3, 915

(56) References Cited

U.S. PATENT DOCUMENTS 6,117,349 A * 9/2000 Huang et al. ............ 438/729 X
6,221,782 B1 * 4/2001 Shan et al. ............. 438/729 X

* cited by examiner

Primary Examiner—William A. Powell
(74) Attorney, Agent, or Firm—Stanton Braden

(57) ABSTRACT

In a method of etching a wafer in a plasma etch reactor, the improvement of conducting etching to reduce or eliminate "black silicon" comprising:

a) providing a plasma etch reactor comprising walls defining an etch chamber;

b) providing a plasma source chamber remote from and in communication with the etch chamber to provide a plasma to the etch chamber, and a wafer chuck or pedestal disposed in the etch chamber to seat a wafer;

c) providing a dielectric wall in proximity to and around a periphery of the wafer;

d) providing a modification to a lower Rf electrode by interposing conductor means into an extension of Vdc flat sheath boundary relationship to the dielectric wall means and the wafer or in substitution for the dielectric wall;

e) forming a plasma within the plasma source chamber and providing the plasma to the etch chamber; and f) supplying Rf energy to the wafer chuck to assist etching of the wafer by forming electric fields between the upper surface of the wafer and the walls of the etch chamber, to provide extension of a Vdc flat sheath boundary beyond and into a defocusing relationship to the wafer edge to reduce mask erosion and eliminate occurrence of "black silicon" formation.

12 Claims, 2 Drawing Sheets

ELIMINATION/REDUCTION OF BLACK SILICON IN DT ETCH

BACKGROUND OF THE INVENTION

1. Field of the Invention

The invention generally relates to the modification of apparatus to cause elimination or reduction of black silicon during a DT (deep trench) etching process during fabrication of integrated circuits (ICs) or chips, in which there is etching into a silicon substrate features used to form microelectronic devices. In particular, the invention relates to the elimination or reduction of black silicon during the DT etch which may serve as a trench capacitor of a memory cell, by causing sheath shaping on the lower electrode assembly in an etching reactor.

2. Description of the Related Art

Integrated circuit (IC) technology has recently moved from large-scale integration (LSI) to very large scale integration (VLSI) and is expected to grow to ultra-large scale integration (ULSI) in the very near future. These advancements in monolithic circuit integration is possible by virtue of improvements in manufacturing equipment and the materials and methods used in preparing semiconductor wafers into IC chips.

Several factors impose increasingly strict requirements on the basic integrated circuit fabrication steps of: masking; film formation; doping and etching; and dielectric insulation.

These factors are: the incorporation of IC chips of increasingly complex devices and circuits; the use of greater device densities and smaller feature sizes, and smaller separation; the use of composite conductor layers; and the use of the third wafer dimension of depth as well as the surface area to form buried or trench capacitors (DT).

In this connection, the ability to etch narrow, deep, high aspect ratio trenches is vital to the formation of buried or trenched capacitors. Further, single crystal silicon trench isolation is increasingly being used in semiconductor research as an alternative to other device isolation technologies, due to the fact that trench dielectric isolation offers a number of advantages, such as relatively small surface area requirements, small width-to-depth ratios, and a vertical wall profile.

A further and significant advantage of the trench technology is its relative simplicity of process. For example, to create a buried capacitor or dielectric isolation structure using trench technology entails reactive ion etching (REI) a groove into a single crystal silicon substrate, oxidizing side walls of the groove or trench, filling the groove with oxide dielectric or a polysilicon, and planarizing the surface.

However, "black silicon" is one of the prevalent etch obstacles during the etching process. Black silicon is caused by the presence of surface contaminates such as residual oxides, that act as localized etched mask. Consequently, the areas beneath these micromasks are not etched away until the contaminates are completely eroded, thereby causing the bottom of the finished trenched substrate to develop a rough, light-scattering dark surface appearance that is responsible for the name "black silicon".

Black silicon formation at the edge of a wafer can also cause loss of chips and therefore directly contributes to chip yield loss.

One of the mechanisms for black silicon formation is the erosion of the boron doped silicate glass (BSG) mask at the edge that causes the exposure of the silicon surface. The higher BSG/Nitride etch rate at the periphery of the wafer is caused by the focusing of ions from the focusing dielectric ring placed around the wafer in the DT (deep trench) etch tool.

U.S. Pat. No. 5,874,362 disclose a method for etching a high aspect ratio, straight walled opening in silicon, in which the opening is characterized by a rounded bottom. The process is conducted by forming a plasma from a precursor gas etch mixture of HBr as the main etchant, using oxygen to provide protection for the side walls of the openings and to control selectivity with respect to the oxide etch mask, employing a fluorine-containing gas to remove residual contaminates from the side walls of the openings, and etching a silicon body until an opening of the desired depth is formed. The use of a brominate and gas chemistry in this process is said to overcome the problem of black silicon.

A method of and apparatus for improving etch uniformity in remote source plasma reactors with a powered wafer chuck or pedestal is disclosed in U.S. Pat. No. 5,662,770. The invention addresses the uniformity problem which arises due to non-uniform power coupling between a wafer and the walls of the etch chamber by increasing the impedance between the wafer and the chamber walls by placing a cylindrical dielectric quartz wall around the wafer if silicon is to be etched selectively with respect to silicon dioxide.

A plasma etch apparatus with heated scavenging surfaces is disclosed in U.S. Pat. No. 5,477,975. The plasma etch reactor is operated by introducing a gas into the reactor which disassociates as a plasma into an etched species which etches oxide films on a work piece in the reactor and a non-etching species combinable with the etched species into an etch-preventing polymer condensable onto the work piece below a certain deposition temperature, thereby providing an interior wall comprising a material which scavenges the etching species, and maintains a temperature of the interior wall above the deposition temperature.

U.S. Pat. No. 5,292,399 disclose a plasma etching apparatus with conductive means for inhibiting arcing. The conductive means for inhibiting arcing from electrical charges accumulating on one or more non-conductive protective surfaces on members at Rf potential within the apparatus includes one or more conductive plugs extending through one or more of the protective surfaces or a conductive ring surrounding the wafer on the top surface of a metal pedestal.

Accordingly, there is a need in the art of fabricating integrated circuits or chips, where features are created by etching into the silicon substrate deep trenches (DT) which serve as a trench capacitor, to flatten the self-developed negative dc bias (Vdc) sheath boundary beyond the edge of the wafer, and thereby reduce DT mask erosion at the wafer periphery to eliminate or reduce "black silicon" in the DT etch.

There is a further need in the art of fabricating integrated circuits or chips where features are created by etching into the silicon substrate a deep trench that serves as a trench capacitor, to reduce DT mask erosion by utilizing a silicon source to provide a deposition component at the edge of the wafer, to assist in the elimination or reduction of black silicon in the DT etch.

SUMMARY OF THE INVENTION

In general, the invention relates to utilizing an electrode configuration with a focusing sheath of a lower electrode assembly in an etching reactor through an innovation that flattens the sheath at the wafer periphery, to effectively defocus ions from the boundary of the self-developed negative dc bias (Vdc). Towards this end, a disc, preferably of silicon, is added to modify an existing quartz ring used as an insulator that is not easily eroded by the etching environment, and the silicon disc is easily replaced without replacing the entire wafer chuck/clamping ring mechanism. By shaping the Vdc sheath at the wafer surface to defocus the ions and thereby reduce the erosion of the BSG mask, elimination and/or reduction of black silicon is accomplished in the DT etch.

One object of the present invention is to provide a modification to the typical electron configuration with focusing sheath used in DT etch to fabricate integrated circuits or chips in which the features created by etching into a silicon substrate are those which are deep trench (DT) features that serve as trench capacitors.

Another object of the present invention is to provide a modification of the typical electron configuration with focusing sheath used in the fabrication of integrated circuits or chips in which features are created by etching into a silicon substrate a deep trench which serves as a trench capacitor, by flattening the sheath at the wafer periphery to effectively defocus the ions that accelerate across the sheath from a dielectric focus ring that forms a boundary of self-developed negative dc bias that causes erosion of the BSG mask at the edge of the wafer to create exposure of the silicon surface, that results in black silicon formation at the edge of the wafer.

In general, the invention is accomplished by the addition of a silicon disc, preferably silicon, in the form of a ring adjacent to a normally present insulating quartz ring, so that the voltage developed in this peripheral area is the same as that over the wafer—thereby creating a condition in which there is an extension of the flat sheath boundary beyond the wafer edge so that the ions are now normal to the wafer surface and thus unfocused or defocused. The shape of this new sheath results in a reduction of the mask erosion at the wafer edge (since the etch rate of BSG is dependent upon ion energy), and thereby protects the silicon surface from exposure to the plasma during the entire DT etch process.

These and other objects of the invention will become apparent by resort to the following description and accompanying drawings.

DETAILED DESCRIPTION OF THE INVENTION

The invention constitutes improvements in apparatus used for rf plasma etching of wafers in a DT etch by affecting sheath shaping on the lower electrode in an etching reactor such as, TEL 88-DRM or AMAT/Mark-II NG reactors. The invention is accomplished by:

a) providing a plasma etch reactor comprising walls defining an etch chamber;

b) providing a plasma source chamber remote from and in communication with the etch chamber to provide a plasma to the etch chamber, and a wafer chuck or pedestal disposed in said etch chamber to seat a wafer;

c) providing a dielectric wall in proximity to and around a periphery of the wafer;

d) providing a modification to a lower Rf electrode by interposing conductor means into an extension of Vdc flat sheath boundary relationship to the dielectric wall means and the wafer or in substitution for the dielectric wall;

e) forming a plasma within said plasma source chamber and providing the plasma to the etch chamber; and f) supplying Rf energy to the wafer chuck to assist etching of the wafer by forming electric fields between the upper surface of the wafer and the walls of the etch chamber, to provide extension of a Vdc flat sheath boundary beyond and into a defocusing relationship to the wafer edge to reduce mask erosion and eliminate occurrence of "black silicon" formation.

Flattening the Vdc sheath boundary at the wafer periphery in the etching reactor de-focuses the direction of the ions near the wafer sheath to avoid the higher ion flux at the wafer edge that causes higher etch rates of the DT mask that results in the phenomenon of "black silicon" during the DT etch.

The prevalent etch problem of "black silicon" is caused by the presence of surface contaminates such as residual oxides that act as localized etch masks. The areas beneath these micromasks are not etched away until the contaminates are completely eroded, thereby creating a condition whereby the bottom at the finished trench substrate develops a rough, light-scattering dark surface appearance that is responsible for the name "black silicon".

Figure 1:
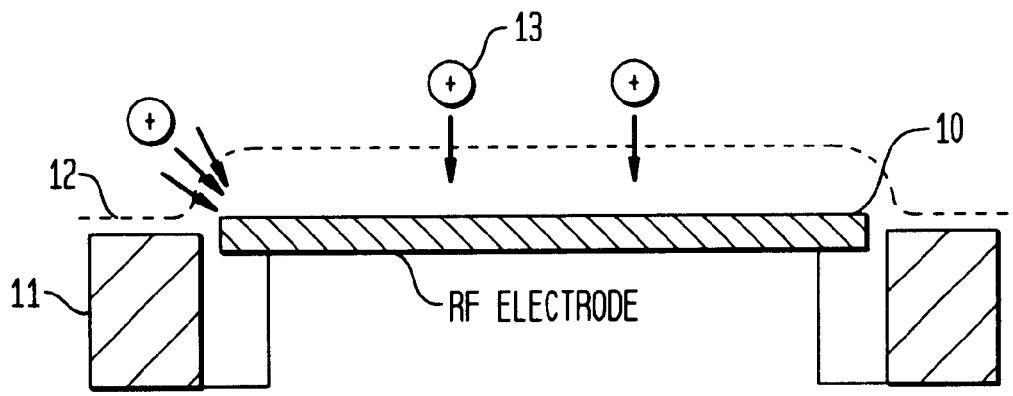
FIG. 1 is a schematic prior art representation of an unmodified electrode configuration with focusing sheath showing a typical lower electrode assembly in an etching reactor that results in black silicon in the DT etch.

In significant part, this phenomenon of black silicon may be understood by reference to the prior art schematic presentation of FIG. 1 in which there is shown a schematic of a typical lower electrode assembly in an etching reactor. The dotted line over the wafer 10 and the dielectric quartz focus ring 11 is the boundary of the self-developed negative dc bias or the Vdc sheath boundary 12. The value of the Vdc determines the energy that the ions 13 gain as they accelerate across this sheath. The directions of ions near the wafer edge, as shown by the arrows, are being focused due to the sheath of the electric field. Higher ion flux at the wafer edge causes higher etch rate of DT mask.

One of the mechanisms for black silicon formation is the erosion of the BSG mask at the edge of the wafer, that causes the exposure of the silicon surface. In other words, the higher BSG/nitride etch rate at the periphery of the wafer is caused by the focusing of ions from the focusing dielectric quartz ring placed around the wafer in the DT etch tool.

To resolve the problem of higher BSG/nitride etch rate at the periphery of the wafer caused by the focusing of ions from the focusing dielectric quartz ring placed around the wafer in the DT etch tool, the invention modification effectively shapes the Vdc sheath at the wafer edge to defocus the ions and thereby reduce the erosion of the mask.

Figure 2:
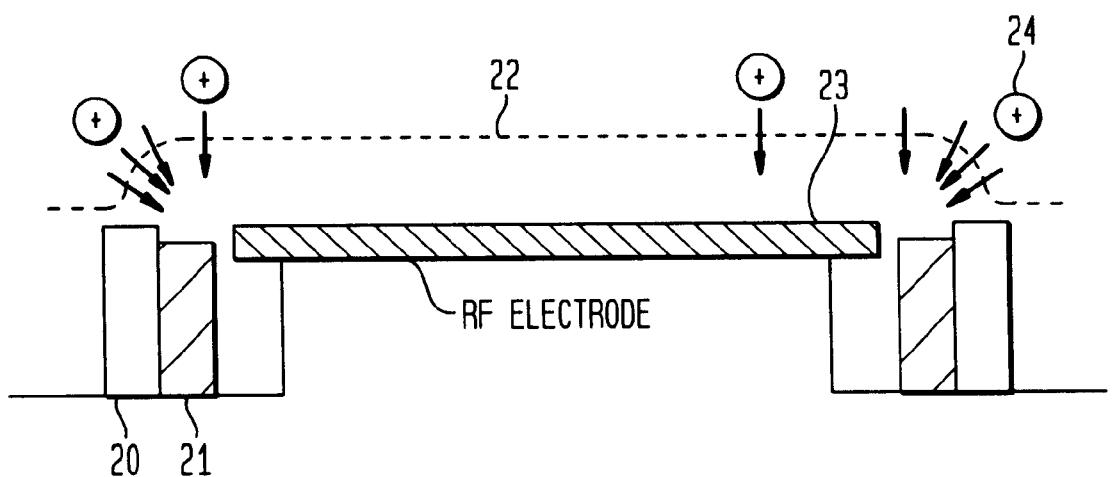
FIG. 2 shows a schematic representation of an electrode configuration of the invention in which a quartz focus ring is modified by the addition of a silicon disc made of the same material as the wafer, and serves to flatten the Vdc sheath boundary at the wafer periphery to effectively defocus the ions and extend the flat Vdc sheath boundary beyond the wafer edge, so that the ions are now normal to the wafer surface, to provide reduction of the mask erosion at the wafer edge and protect the silicon surface from exposure to the plasma during the entire DT etch process.

In the embodiment of the invention shown in FIG. 2, the quartz ring design 20 is modified by the insertion of a silicon conductor 21 in adjacent relationship to the quartz ring. This modification has the effect of flattening the Vdc sheath boundary 22 at the periphery of the wafer 23, to effectively defocus the ions 24. Addition of the silicon disc to modify the existing quartz ring is such that, since the disc is made of the same material as the wafer, the voltage developed in this peripheral area is the same as that over the wafer, and results in an extension of the flat sheath boundary well beyond the wafer edge, as can been seen in FIG. 2.

In FIG. 2 the direction of ions as indicated by the arrows show the manner in which the ions strike the edge of the wafer. The ions are now, as a result of this modification, normal to the wafer surface and, therefore, unfocused. It has been found that the sheath of this new Vdc sheath boundary reduces the mask erosion at the wafer edge (since the etch rate of the BSG is dependent upon ion energy), and serves to protect the silicon surface from exposure to the plasma during the entire DT etch process.

While the embodiments shown in FIG. 2 is preferred, other configurations of the lower electrode assembly in the etching reactor may also be utilized in the context of the invention.

Figure 3:
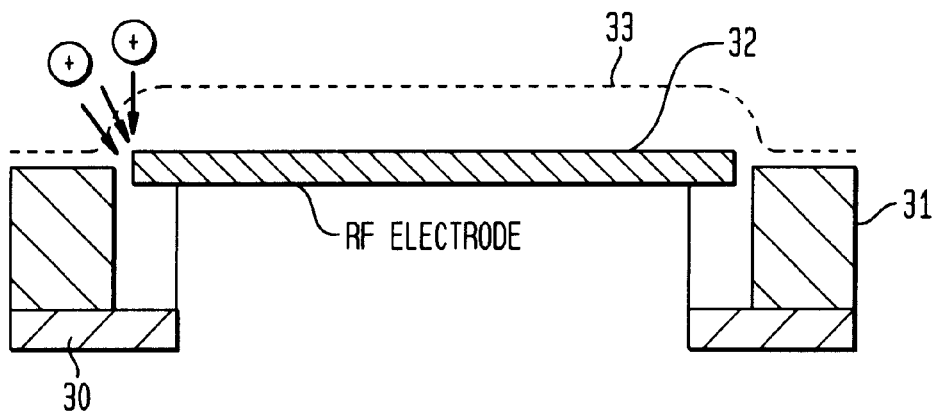
FIG. 3 is a schematic showing the invention modification of the quartz focus ring by use of a silicon ring at the base of the quartz focus ring.

For example, in the lower electrode assembly of the invention modification shown in FIG. 3, the silicon disc 30 is disposed beneath quartz focus ring 31 and the silicon wafer 32 bears substantially the same relationship to Vdc sheath boundary 33 as is shown in the invention in FIG. 2.

Figure 4:
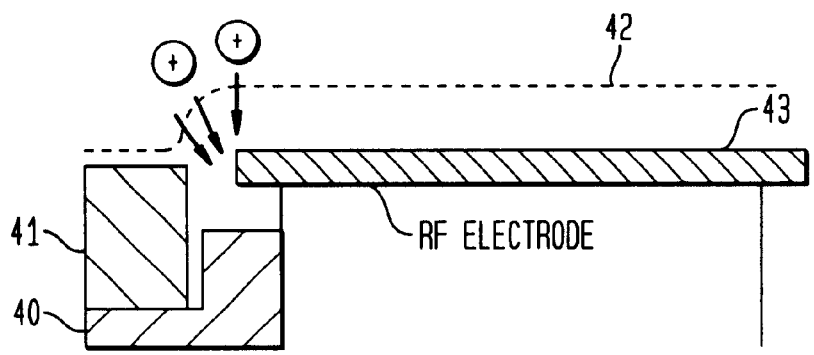
FIG. 4 is a schematic of another embodiment of the invention in which the quartz focus ring is modified by a silicon ring disposed in a lap-joint type configuration under the quartz focus ring.

The lower electrode assembly modification of FIG. 4 utilizes a silicon ring 40 at the base of quartz focus ring 41 in a lap-joint type relationship to the quartz focus ring. Nevertheless, as may be seen from the Vdc sheath boundary 42, the relationship that silicon wafer 43 bears to the Vdc sheath boundary is substantially the same as that shown in FIGS. 2 and 3.

Figure 5:
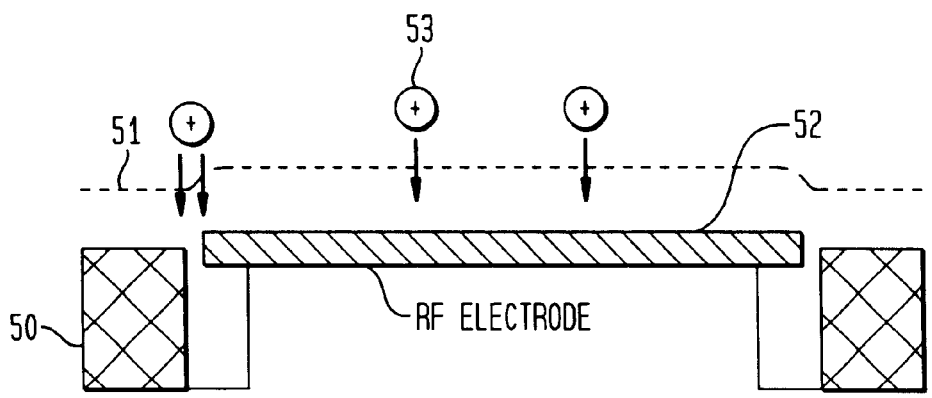
FIG. 5 is a schematic representation of the invention modification in which a silicon focus ring is used in substitution for the quartz focus ring.

In FIG. 5 the quartz focus ring of the lower electrode assembly in the etching reactor has been totally replaced by substitution of a silicon focus ring 50. The silicon focus ring is a conductor (as opposed to the dielectric quartz focus ring). As is evident form the Vdc sheath boundary 51 the relationship of the wafer 52 to the ions 53 is substantially the same as that shown in FIGS. 2–4.

While conductor type materials other than silicon may be used in the context of the invention in replacement of or addition to the dielectric quartz focus ring, the use of silicon is preferred as the silicon disc or insert serves the additional role as a silicon source during etching, and thereby enhances the deposition reaction at the edge of the wafer—and this enhanced deposition reaction serves to further decrease mask erosion.

The thickness of the silicon insert that is etched continuously during processing is designed to be such that it needs to be replaced only when the reactor is opened up for wet cleaning. Further, the thickness and shape of the silicon ring may differ from those shown in the specifically preferred embodiments to enable adaptation to any specific electrode design.

As may be seen from the foregoing description, the provision of a silicon ring to flatten the Vdc sheath boundary beyond the edge of the wafer and thereby reduce DT mask erosion at the wafer periphery is a significant advance over the prior art schematic of FIG. 1 showing a typical lower electrode assembly in an etching reactor.

Another significant advantage of the invention modification of a lower electrode assembly used in an etching reactor for etching silicon wafers is the use of a silicon ring as a silicon source for providing a deposition component at the edge of the wafer, that serves to further reduce DT mask erosion.

While the foregoing preferred embodiments depict various configurations for shaping the Vdc sheath boundary and providing a peripheral silicon source, it is to be understood that many modifications may be made within the invention taught without departing from the spirit and scope of the invention, which is limited only by the appended claims.

We claim:

1. In a method of etching a wafer in a plasma etch reactor, the improvement of conducting etching to reduce or eliminate "black silicon" comprising:

a) providing a plasma etch reactor comprising walls defining an etch chamber;

b) providing a plasma source chamber remote from and in communication with said etch chamber to provide a plasma to said etch chamber, and a wafer chuck or pedestal disposed in said etch chamber to seat a wafer;

c) providing a dielectric wall in proximity to and around a periphery of said wafer;

d) providing a modification to a lower Rf electrode by interposing conductor means into an extension of Vdc flat sheath boundary relationship to said dielectric wall means and said wafer or in substitution for said dielectric wall;

e) forming a plasma within said plasma source chamber and providing said plasma to said etch chamber; and f) supplying Rf energy to said wafer chuck to assist etching of said wafer by forming electric fields between the upper surface of said wafer and the walls of the etch chamber, to provide extension of a Vdc flat sheath boundary beyond and into a defocusing relationship to the wafer edge to reduce mask erosion and eliminate occurrence of "black silicon" formation.

2. The method of claim 1 wherein said conductor means into extension of Vdc flat sheath boundary relationship to said dielectric wall means is silicon and said dielectric wall is quartz.

3. The method of claim 2 wherein said conductor means is a silicon in the form of a wall inserted in adjacent relationship to said quartz wall.

4. The method of claim 2 wherein said silicon is in the form of a disc and disposed beneath said quartz wall in spaced-relationship to said wafer.

5. The method of claim 2 wherein said silicon is disposed beneath said quartz wall in lap-joint and spaced apart relationship to said wafer.

6. The method of claim 1 wherein said conductor means is substituted for said dielectric wall.

7. In a plasma etching apparatus for plasma etching of wafers comprising a chuck having a top surface on which said wafer to be etched is supported, the improvement to reduce or eliminate "black silicon" during etching comprising: a modification to the shape of a lower Rf electrode comprising an interposing conductor means into an extension of Vdc flat sheath boundary relationship to dielectric wall means and said wafer or in substitution for dielectric means disposed about the periphery of said wafer.

8. The apparatus of claim 7 wherein said conductor means is silicon and said dielectric means is quartz.

9. The apparatus of claim 8 wherein said conductor means is silicon in the form of a wall disposed in adjacent relationship to said quartz.

10. The apparatus of claim 8 wherein said silicon is in the form of a disc and disposed beneath said quartz means in spaced-relationship to said wafer.

11. The apparatus of claim 8 wherein said silicon means is disposed beneath said quartz means in lap-joint and spaced apart relationship to said wafer.

12. The apparatus of claim 8 wherein said conductor means is substituted for said dielectric means.

* * * * *